(12) United States Patent
Kong et al.

(10) Patent No.: US 11,139,817 B1
(45) Date of Patent: Oct. 5, 2021

(54) VOLTAGE-CONTROLLED OSCILLATOR CALIBRATION

(71) Applicant: Apple Inc., Cupertino, CA (US)

(72) Inventors: Long Kong, Campbell, CA (US); Simone Gambini, San Francisco, CA (US); Cristian Marcu, San Jose, CA (US); Nachum M. Kanovsky, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/855,828

(22) Filed: Apr. 22, 2020

(51) Int. Cl.
*H03L 7/091* (2006.01)
*H03L 7/099* (2006.01)
*H03L 7/189* (2006.01)
*H03L 7/10* (2006.01)

(52) U.S. Cl.
CPC ............ *H03L 7/0992* (2013.01); *H03L 7/091* (2013.01); *H03L 7/0995* (2013.01); *H03L 7/104* (2013.01); *H03L 7/189* (2013.01)

(58) Field of Classification Search
CPC ... H03L 7/00; H03L 7/08; H03L 7/087; H03L 7/091; H03L 7/0995; H03L 7/101–104; H03L 2207/06
See application file for complete search history.

(56) References Cited

U.S. PATENT DOCUMENTS

| 5,298,867 | A | * | 3/1994 | Mestha | H03L 7/00 |
| | | | | | 315/500 |
| 5,726,607 | A | | 3/1998 | Brede et al. | |
| 6,459,253 | B1 | * | 10/2002 | Krusell | H03L 7/07 |
| | | | | | 324/76.53 |
| 7,742,553 | B1 | * | 6/2010 | Bataineh | H03C 3/0991 |
| | | | | | 375/376 |
| 8,836,434 | B2 | | 9/2014 | Bellaouar et al. | |
| 9,258,001 | B1 | * | 2/2016 | Das | H03L 7/146 |
| 9,954,543 | B1 | * | 4/2018 | Chan | H03L 7/0995 |
| 2003/0224749 | A1 | * | 12/2003 | Uozumi | H03L 7/099 |
| | | | | | 455/252.1 |
| 2004/0196107 | A1 | * | 10/2004 | Sogawa | H03L 7/113 |
| | | | | | 331/16 |
| 2006/0145776 | A1 | | 7/2006 | Shi et al. | |
| 2009/0072911 | A1 | * | 3/2009 | Ke | H03L 7/18 |
| | | | | | 331/16 |

(Continued)

*Primary Examiner* — Levi Gannon
(74) *Attorney, Agent, or Firm* — Kowert, Hood, Munyon, Rankin & Goetzel, P.C.

(57) ABSTRACT

A computer system may periodically calibrate an oscillator subsystem, which includes a voltage-controlled oscillator circuit configured to generate an oscillator signal using code signal. In response to activation of a calibration mode, an iterative calibration operation may be performed on the voltage-controlled oscillator circuit. In some cases, performing a given iteration of the calibration operation includes determining a value of the code signal using a number of pulses in the oscillator signal sampled during a particular time period, along with previous values of the code signal and a slope of an error function associated with the difference between a desired frequency and a current frequency of the oscillator signal. In other cases, iterations may employ variable sampling times with error handling, in order to decrease the duration of the calibration operation while maintaining a target accuracy.

22 Claims, 14 Drawing Sheets

(56) References Cited

U.S. PATENT DOCUMENTS

| | | | | |
|---|---|---|---|---|
| 2011/0260763 A1* | 10/2011 | Wang | .................. | H03L 7/099 |
| | | | | 327/157 |
| 2011/0267146 A1* | 11/2011 | Finocchiaro | ............ | H03L 7/103 |
| | | | | 331/2 |
| 2014/0210532 A1* | 7/2014 | Jenkins | .................. | H03L 7/16 |
| | | | | 327/159 |
| 2014/0266472 A1* | 9/2014 | Waldrip | ................ | H03L 7/103 |
| | | | | 331/17 |
| 2020/0177190 A1* | 6/2020 | Shumaker | ............ | H03L 7/1806 |

* cited by examiner

VOLTAGE-CONTROLLED OSCILLATOR CALIBRATION

BACKGROUND

Technical Field

This disclosure relates to oscillator circuits in computer systems and more particularly to calibrating oscillator circuit.

Description of the Related Art

A computer system may employ one or more timing signals of various frequencies (also referred to as "clock signal"), which provide time references to perform various operations. For example, a computer system may use a particular clock signal to operation latch or flip-flop circuits used to capture value of logic signals. In some cases, a clock signal may be used to determine when a state machine or sequential logic circuit transitions from one state to another.

Clock signals may also be used to coordinate the transfer of data between different circuit blocks within the computer system or between computer systems. For example, a clock signal may be used to transmit data from computer system to another computer system. The computer system receiving the transmitted data may just another clock signal to determine when to sample the transmitted data.

A computer system may employ a variety of circuit to generate clock signals. In some cases, a crystal oscillator may be used to generate a reference clock signal with a precise frequency that can be used to generate clock signals of other frequencies. To generate clock signals of other frequencies, a computer system may employ a phase-locked loop circuit, a delay-locked loop circuit, or other suitable circuits for generating a clock signal using a reference clock signal.

SUMMARY OF THE EMBODIMENTS

Various embodiments of an oscillator calibration circuit are disclosed. Broadly speaking, a voltage-controlled oscillator may be configured to generate an oscillator signal, and a calibration circuit may be configured, in response to an activation of a calibration mode, perform an iterative calibration operation on the voltage-controlled oscillator to generate a final value of a code signal. To perform a particular iteration of the iterative calibration operation, the calibration circuit may be further configured to determine, over a particular period of time, a number of pulses includes in the oscillator signal, and determine a particular value for the code signal using the number of pulses included in the oscillator signal, a first previous value of the code signal, and a slope of an error function between the first previous value of the code signal and a second previous value of the code signal. The voltage-controlled oscillator may be further configured to modify a frequency of the oscillator signal using a given value of the code signal. In a different embodiment, the calibration circuit may be further configured to generate an enable signal that has a duration that is based, at least in part, on a particular number of pulses of a reference signal. In another embodiment, the calibration circuit may be further configured to re-time the enable signal to generate a re-timed enable signal.

Figure 1:
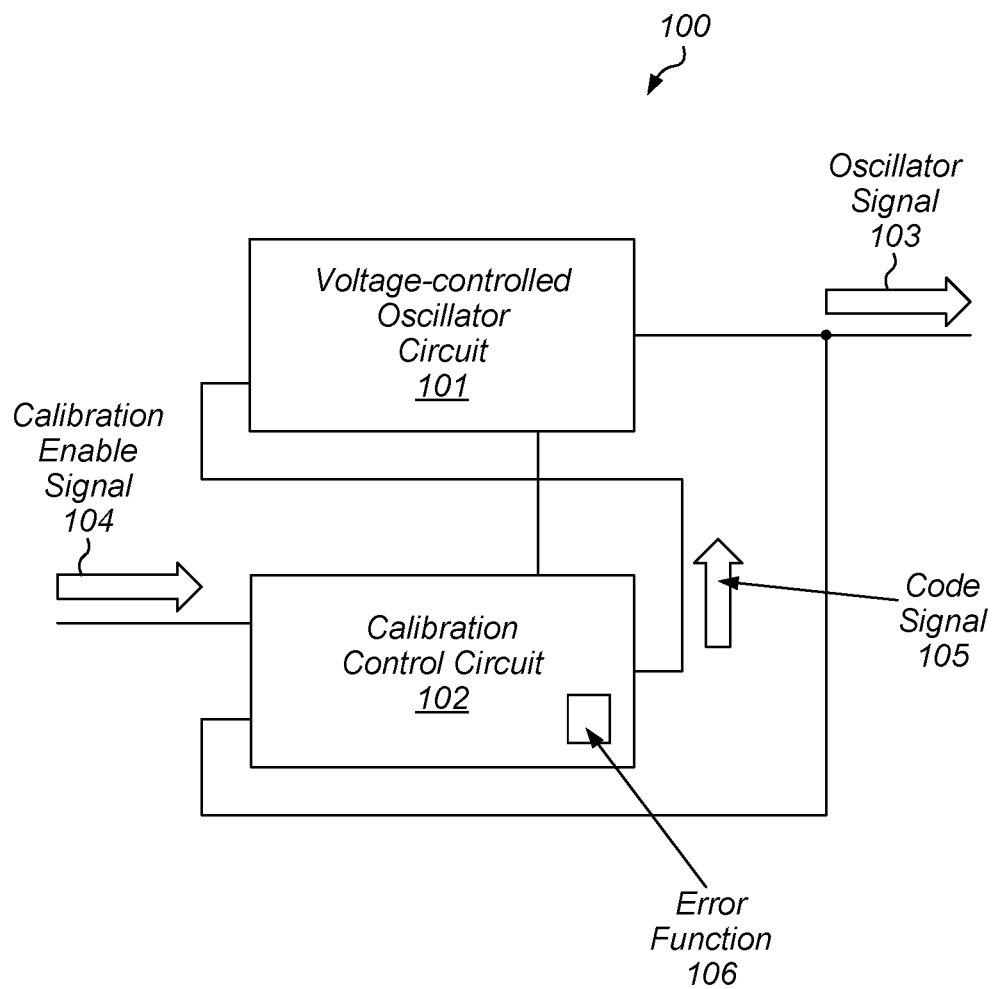
FIG. 1 is a block diagram of an embodiment of an oscillator subsystem.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

A computer system may employ one or more transceiver circuits to communicate with other computer systems. Such transceiver circuits often include a phase-locked loop circuit that generates a clock signal of a desired frequency that is used as a timing reference to send and/or receive data. To allow for proper communication, the transceiver circuits may need to have a low latency and short settling times upon initialization or in response to a change in a frequency used in the communication. The latency and settling times of a transceiver circuit may be determined, at least in part, by a phase-locked loop circuit included in the transceiver circuit.

Phase-locked loop circuits include a voltage-controlled oscillator whose frequency is controlled using an analog control loop that compares respective phases of an oscillator signal generated by the voltage-controlled oscillator and a reference clock signal. When a phase-locked loop is initialized or a change in frequency is needed, the analog control loop of the phase-locked loop circuit will, over a period of time, determine a new voltage level for the control signal to the voltage-controlled oscillator. The time for the analog control loop to reach the new voltage level (referred to as "settling time") may be too long for certain applications, such as the aforementioned communication. To reduce the settling time, some phase-locked loop circuits may employ a calibration circuit, which breaks and analog control loop and computes a digital code word that sets the voltage-controlled oscillator to a frequency close to the desired frequency.

To determine a value for the digital code word a binary search of available code words may be employed. For each search step, an estimate of the frequency of the voltage-controlled oscillator is made by counting a number of pulses of the oscillator signal in a given time window. The length of the given time window times the number of search steps is the duration of the calibration operation. The embodiments illustrated in the drawings and described below provide techniques for calibrating a voltage-controlled oscillator while reducing a number of iterations, thereby reducing the calibration time of the voltage-controlled oscillator.

A block diagram of an oscillator subsystem is depicted in FIG. 1. As illustrated, oscillator subsystem 100 includes voltage-controlled oscillator circuit 101 and calibration control circuit 102.

Voltage-controlled oscillator circuit 101 is configured to generate oscillator signal 103. In some embodiments, voltage-controlled oscillator circuit 101 may be further configured to modify a frequency of oscillator signal 103 using a given value of code signal 105. Voltage-controlled oscillator circuit 101 may, in various embodiments, include a ring oscillator that includes multiple current-starved inverters, or any other suitable circuit.

Calibration control circuit 102 is configured, in response to an activation of a calibration mode by calibration enable signal 104, to perform an iterative calibration operation on voltage-controlled oscillator circuit 101 to generate a final value of code signal 105. To perform a particular iteration of the iterative calibration operation, calibration control circuit 102 is further configured to determine, over a particular period of time, a number of pulses included in the oscillator signal, and determine a particular value for code signal 105 using the number of pulses included in the oscillator signal, a first previous value of code signal 105, and a slope of error function 106 between the first previous value of code signal 105 and a second previous value of code signal 105. As described below in more detail, error function 106 represents a difference between a particular value of the frequency of oscillator signal 103 and a desired frequency of oscillator signal 103.

Figure 2:
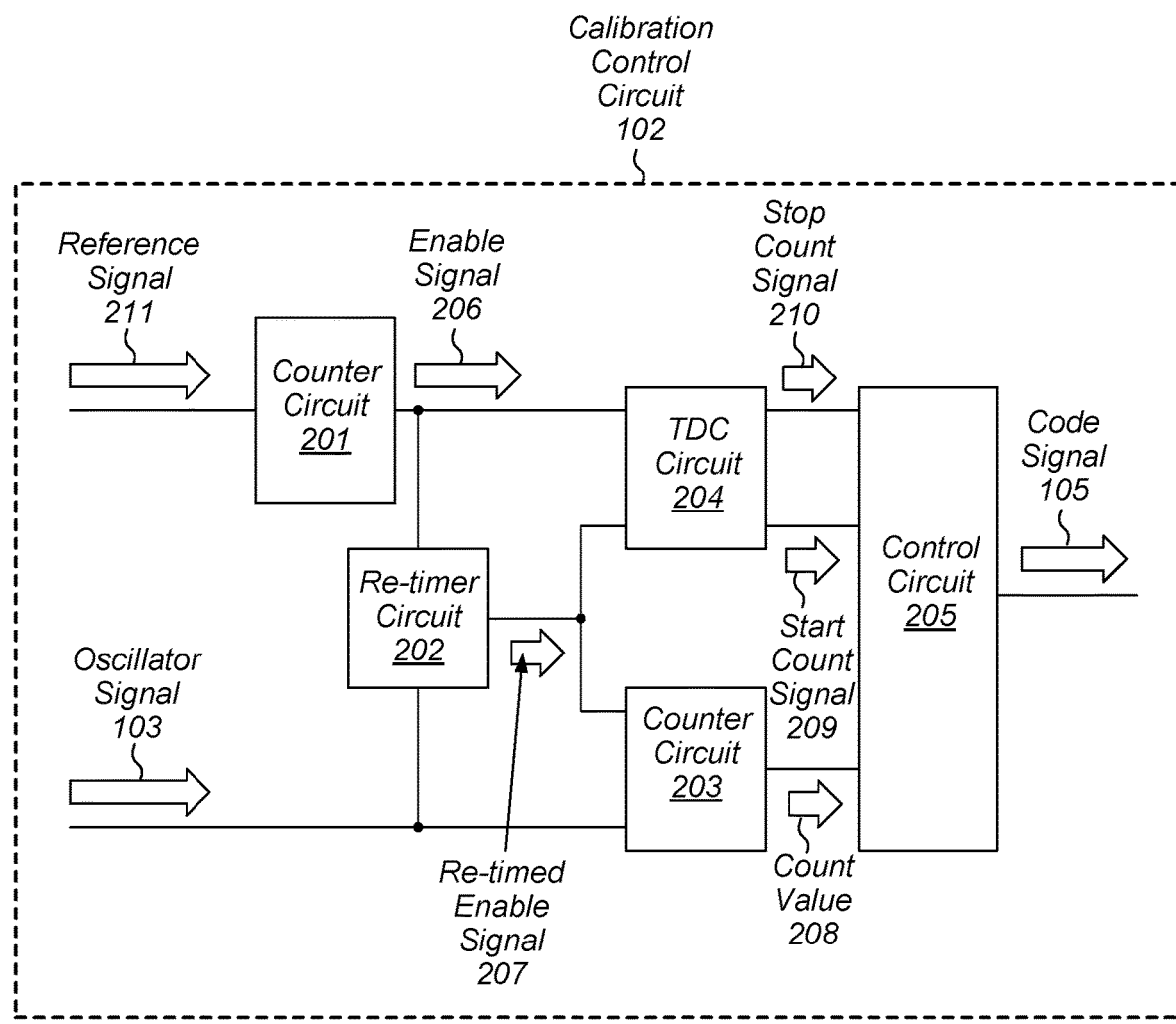
FIG. 2 illustrates a block diagram of an embodiment of calibration control circuit.

Various techniques and circuits may be employed to generate values for code signal 105. A block diagram of an embodiment of calibration control circuit 102 is depicted in FIG. 2. As illustrated, calibration control circuit 102 includes counter circuit 201, re-timer circuit 202, counter circuit 203, a time-to-digital converter circuit 204 (denoted as "TDC circuit 204"), and control circuit 205.

Counter circuit 201 is configured to generate enable signal 206 using reference signal 211. In some embodiments, counter circuit 201 may be a particular embodiment of a sequential logic circuit configured to assert enable signal 206 for a given number of pulses included in reference signal 211. In some cases, counter circuit 201 is initialized at the beginning of a given iteration of the iterative calibration operation.

Re-timer circuit 202 is configured to generate re-timed enable signal 207. As described below in more detail, re-timer circuit 202 may include multiple sample and hold type circuits configured to generate a re-timed version of enable signal 206 whose transitions are synchronized with transitions of oscillator signal 103 as opposed to transitions of reference signal 211. By employing such a re-timer circuit, a lower power circuit topology for TDC circuit 204 may be selected.

Counter circuit 203 may be a particular embodiment of a sequential logic circuit configured to generate count value 208 using oscillator signal and re-timed enable signal 207. For example, counter circuit 203 may be configured to generate count value 208 such that count value 208 corresponds to a number of pulses included in oscillator signal 103 during a period of time that re-timed enable signal 207 is asserted. In some embodiments, counter circuit 203 may be reset at the conclusion of a given iteration of the iterative calibration operation.

TDC circuit 204 is configured to generate stop count signal 210 and start count signal 209 using enable signal 206 and re-timed enable signal 207. As described below in more detail, TDC circuit 204 includes multiple flip-flop circuits configured to sample delayed versions of enable signal 206 using different transitions, e.g., low-to-high transition or high-to-low transition, of re-timed enable signal 207. In various embodiments, start count signal 209 is a value indicative of a difference in time between the assertion of enable signal 206 and the assertion of re-timed enable signal 207, and stop count signal 210 is a value indicative of a different in time between the de-assertion of enable signal 206 and the de-assertion of re-timed enable signal 207.

In various embodiments, the use of TDC circuit 204 improves the frequency resolution of calibration control circuit 102. Control circuit 205 may be configured to use start count signal 209 and stop count signal 210 to adjust the value of the frequency of oscillator signal 103 determined using count value 208. Using such an adjusted value of the frequency of oscillator signal 103, the convergence of the search method, e.g., a Newton search method, may be improved and a number of iterations reduced, thereby improving performance and reducing power consumption.

Control circuit 205 may be configured to perform an iterative search process to determine a final value for code signal 105 using stop count signal 210, start count signal 209, and count value 208. As described below in more detail, the iterative search process may include a Newton search method, where a new value of code signal 105 is determined based on a previous value of code signal 105, and a slope of an error function at the previous value of code signal 105. In various embodiments, the error function may correspond to a difference between a desired frequency of oscillator signal 103 and an actual frequency of oscillator signal 103 as a function of code signal 105.

In various embodiments, control circuit 205 may be a particular embodiment of a state machine or sequential logic circuit. In some cases, control circuit 205 may include a general-purpose processor configured to execute a plurality of program or software instructions to implement the iterative calibration operation.

Figure 3:
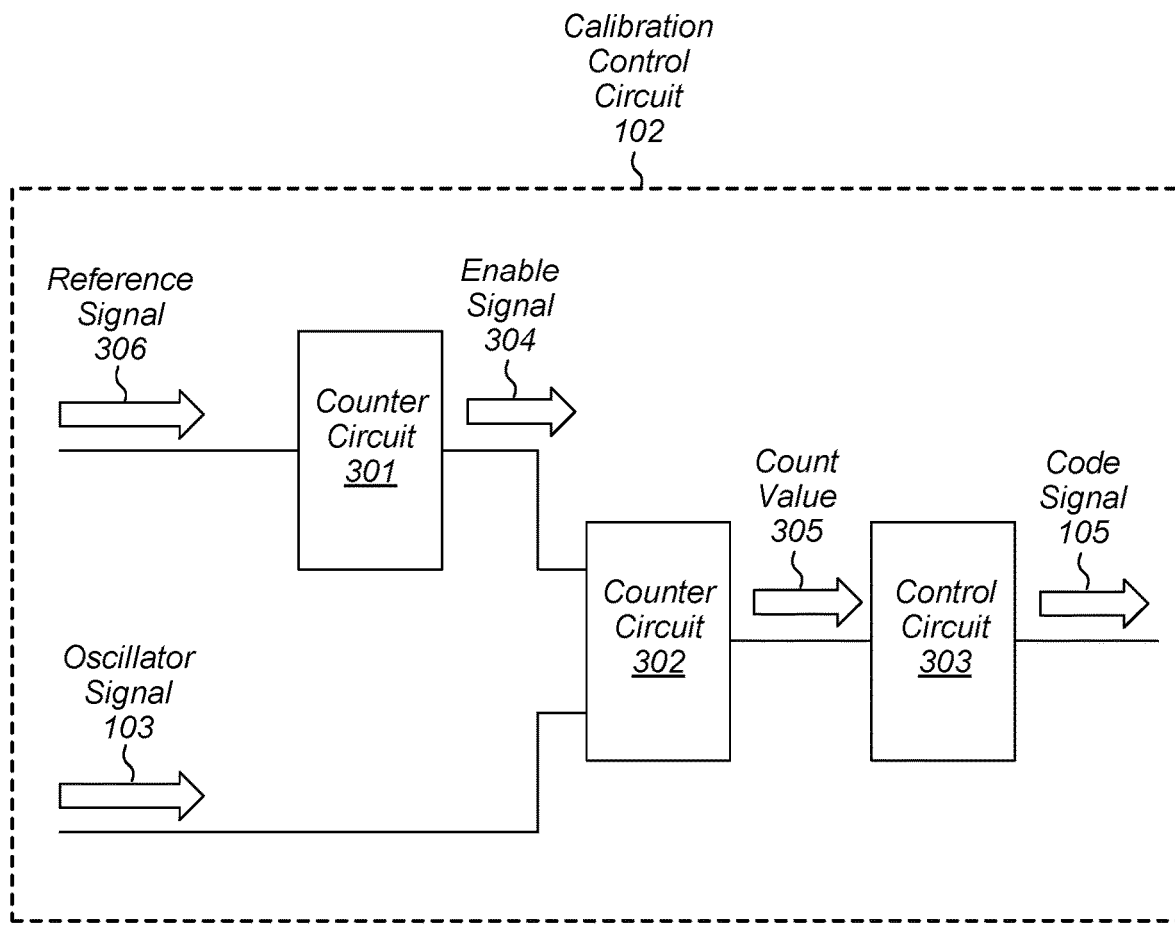
FIG. 3 illustrates a block diagram of another embodiment of a calibration control circuit.

In some cases, the addition frequency resolution provided by employing a time-to-digital converter circuit may not be needed. In such cases, the topology of calibration control circuit 102 may be simplified. Turning to FIG. 3, a block diagram of a different embodiment of calibration control circuit 102 is illustrated. As illustrated, calibration control circuit 102 includes counter circuit 301, counter circuit 302, and control circuit 303.

Counter circuit 301 is configured to generate enable signal 304 using reference signal 306. In various embodiments, counter circuit 301 is a particular embodiment of a sequential logic circuit that asserts enable signal 304 for a particular number of pulses included in reference signal 306. Once the particular number of pulses have been tracked, counter circuit 301 may remain inactive until control circuit 303 determines an updated value for code signal 105, at which point, counter circuit 301 may be re-enabled in order to perform another iteration of a Newton search, or other suitable search algorithm used to determine a final value for code signal 105.

Counter circuit 302 is configured to generate count value 305 using enable signal 304 and oscillator signal 103. In some cases, counter circuit 302 is a particular embodiment of a sequential logic circuit configured to determine a number of pulses included in oscillator signal 103 for the duration of a time period defined by an assertion of enable signal 304. Count value 305 may, in some embodiments, be indicative of a frequency of oscillator signal 103.

Control circuit 303 may, in various embodiments, be a particular embodiment of a state machine, sequential logic circuit, or general-purpose processor circuit configured to determine values for code signal 105. In some cases, control circuit 303 may be configured to perform an iterative search process to determine a final value for code signal 105. As described below in more detail, the iterative search process may include a Newton search method, where a new value of code signal 105 is determined based on a previous value of code signal 105, and a slope of an error function at the previous value of code signal 105. In various embodiments, the error function may correspond to a difference between a desired frequency of oscillator signal 103 and an actual frequency of oscillator signal 103 as a function of code signal 105.

The final value for code signal 105 may be based on a comparison of a threshold value and a difference between a desired frequency for oscillator signal 103 and frequency of oscillator signal 103 generated using code signal 105. In some cases, when the determined difference is less than or equal to the threshold value, the iterative search process may halt, and the calibration operation may conclude.

The control circuits depicted in FIG. 2 and FIG. 3 may implement a particular embodiment of a Newton search method as part of a calibration operation that is performed on voltage-controlled oscillator circuit 101. Such methods include sampling oscillator signal 103 for a particular period of time to determine a count value, e.g., count value 208, that corresponds to the frequency of oscillator signal 103. The determined count value is then used to determine a next value for code signal 105.

Figure 4:
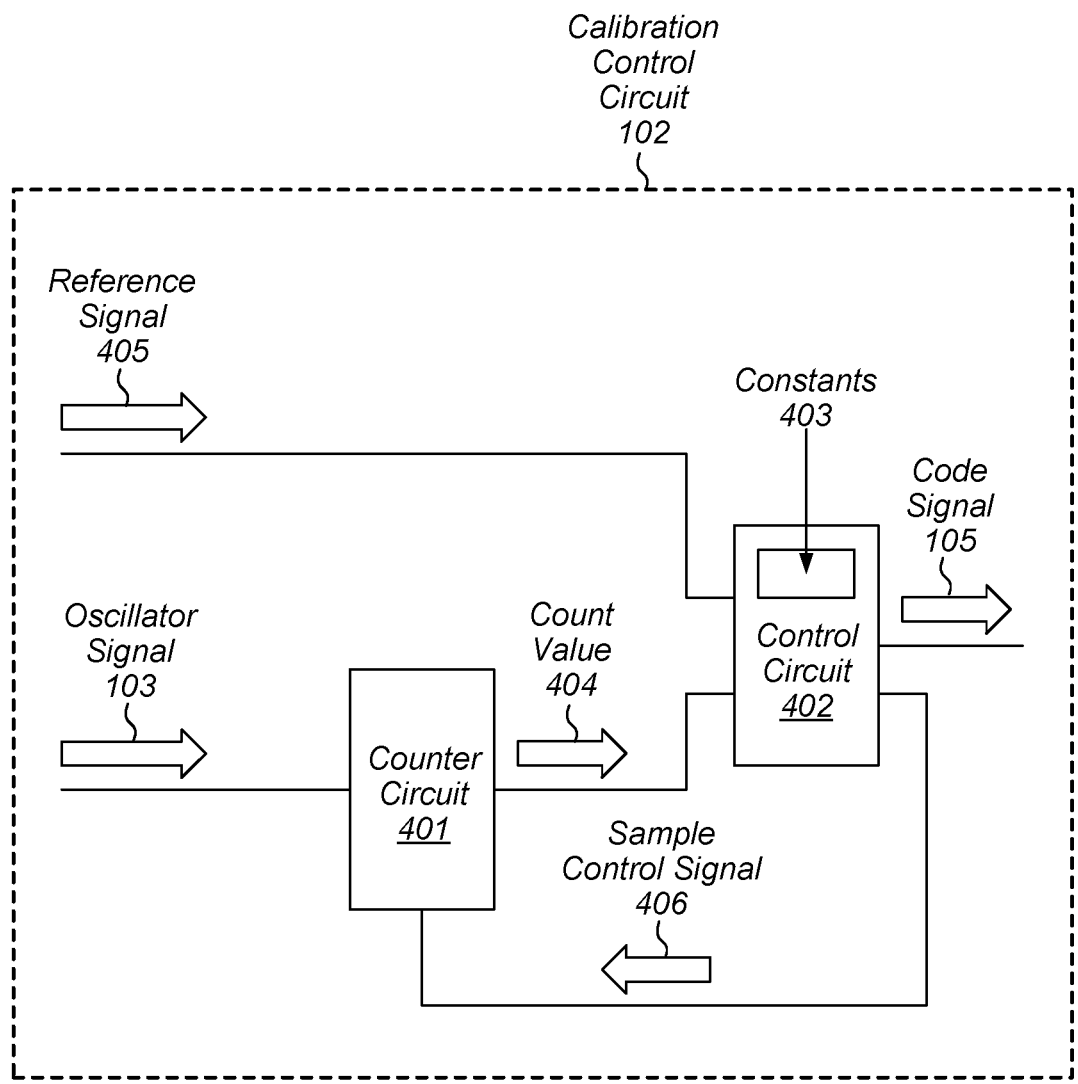
FIG. 4 illustrates a block diagram of a different embodiment of a calibration control circuit.

The inventors realized that, in some cases, sampling for the particular period of time generates count values that are more accurate than needed to determine a value for code signal 105 for the next iteration of the calibration operation. The embodiment of calibration control circuit 102 depicted in FIG. 4, performs a modified version of a binary search (referred to herein as "quick binary") that uses reduced sampling times in order to more quickly converge to a value for code signal 105 that results in a desired frequency for oscillator signal 103. As illustrated, calibration control circuit 102 includes counter circuit 401, and control circuit 402. It is noted that code signal 105 may, in various embodiments, be a binary number encoded using any suitable number of bits.

Counter circuit 401 is configured to sample, using sample control signal 406, oscillator signal 103 to generate count value 404. In various embodiments, counter circuit 401 may be a particular embodiment of a sequential logic circuit configured to determine a number of pulses that occur in oscillator signal 103 during a given period of time. In some cases, the given period of time is determined by sample control signal 406.

Using a counter circuit, e.g., counter circuit 401, to measure a frequency of a signal may result in an error in the measurement of the frequency. For example, the cycle count may be fractional, e.g., 100.5 cycle, when the cycles are counted over a reference period. Alternatively, or additionally, the counter circuit may miss a portion of either, or both, of the first or last cycle. Such errors may be circuit or system specific. When using the quick binary algorithm, the error in the measurement of the frequency may be larger than when using a conventional binary search algorithm.

Control circuit 402 may, in various embodiments, be a particular embodiment of a state machine, sequential logic circuit, or general-purpose processor circuit configured to determine values for code signal 105 using count value 404 and constants 403. Control circuit 402 may be further configured to generate sample control signal 406 as part of an iterative process to determine a value for code signal 105. In some cases, control circuit 402 may generate a different value for sample control signal 406 for each iteration included in the iterative process. The values for sample control signal 406 may start at a minimum value to generate a minimal sampling time. As used and described herein, a minimal sampling time is a shortest period of time between samples of a particular signal as performed by a sampling circuit or mechanism. For example, in a case where the sampling circuit or mechanism employs a clock signal to determine when to sample the particular signal, then the minimal sampling time corresponds to one cycle of the clock signal. In some cases, the value for sample control signal 406 may increase with each iteration, until a maximum value is reached. In various embodiments, a number of iterations included in the iteration process may be based, at least in part, on a number of bits included in code signal 105.

In various embodiment, for a given change in code signal 105, there is a corresponding change in frequency of oscillator signal 103. A smallest change in count value 404 produced by a change in code signal 105 may be referred to as the minimum count to code ratio. It is noted that the count to code ratio is based, at least in part, on the response of voltage-controlled oscillator circuit 101 and the sampling time used to generate count value 404.

When generating code signal 105, control circuit 402 may be further configured to check the reachability of a new value for code signal 105. As used and defined herein, reachability refers to a number of values for code signal 105 that can be generated during remaining iterations of the iterative calibration process. Quick binary achieves quick convergence times by using reduced sampling times. As the sampling times are reduced, error in count value 404 increases. The error in count value 404 may increase provided that for any resultant code value, the number of codes values between the resultant code value and a target code value corresponding to the desired frequency of oscillator signal 103 can be reached (or traversed) within a remaining number of iterations.

In a conventional binary search, there are constraints on how the value of code signal 105 can be changed in order to find a calibration value for code signal 105 that corresponds to a desired frequency of oscillator signal 103 after the calibration operation has completed. For example, if the value of code signal 105 is increased, the calibration value for code signal 105 cannot be less than the previous value of code signal 105. In a similar fashion, if the value of code signal 105 is decreased, the calibration value for code signal 105 cannot be greater than the previous value of code signal 105.

In a quick binary search, such constraints are not needed, provided that, within a particular iteration, the calibration value for code signal 105 is reachable, within remaining iterations of the iterative calibration process, from a next value of code signal 105 generated in the particular iteration. It is noted that due to the error introduced with the reduced sampling times, control circuit 402 may generate the next value of code signal 105 that is further away from the calibration value of code signal 105 than the current value of code signal 105. This is not problem, provided that the calibration value of code signal 105 is reachable from the next value of code signal 105 within the remaining number of iterations.

During a conventional binary search, the value of code signal 105 changes by a maximum amount. Quick binary searching allows the value of code signal 105 to change less than the maximum amount from one iteration to another, but no more than the maximum amount. In various embodiments, control circuit 402 may be configured to change a value of code signal 105 by up to a value of $2^{(N-2-Iteration)}$, where N is the total number of iterations, and Iteration is the current iteration number. Control circuit 402 may, in some embodiments, be configured to calculate a new value of code signal 105 according to Equation 1, where $Code_{Next}$ is the new value of code signal 105 for the next iteration, Code is the current value of code signal 105, $Count_{Target}$ is a value of code signal 105 that corresponds to oscillator signal, $Count_{Current}$ is the value of count value 404 for the current iteration, and $Max_{Change}$ is the maximum value the $Code_{Next}$ can change for a given iteration.

$$Code_{next} = \qquad (1)$$
$$Code + Clamp(Count_{Target} - Count_{Current}, -Change_{max}, Change_{max})$$

It is noted that the formula depicted in Equation 1 is merely an example. In other embodiments, $Code_{Next}$ can be determined using any suitable operation on Code and the difference between $Count_{Target}$ and $Count_{Current}$. For example, in some cases, Code may be scaled, and then combined with the difference between $Count_{Target}$ and $Count_{Current}$ using multiplication, division, or any other suitable operator. As shown in Equation 1, a clamp function may be used in conjunction with any combination of operators to limit the change in in code signal 105 within a given iteration.

Constants 403 may be stored in one or more registers, a static random-access memory, or other suitable storage circuit. In various embodiments, constants 403 may include values associated with the oscillator subsystem 100, such as, error in counting pulses in oscillator signal 103, resolution of a reference time, the smallest change in count value 404 results from a minimum change in code signal 105, or any other suitable characteristics. Constants 403 may be stored during an initialization or startup procedure. In some cases, constants 403 may be changed over the lifetime of oscillator subsystem 100 to accommodate changes in voltage-controlled oscillator circuit 101 and the like.

It is noted that the above description of quick binary is a single dimension application, where a search is performed on a single variable, i.e., the count value, to determine a value that results in a desired frequency for oscillator signal 103. The quick binary algorithm can be generalized to an arbitrary vector space where the search is performed across multiple variables to achieve a desired value of any suitable characteristic of a circuit, computer system, and the like.

Figure 5:
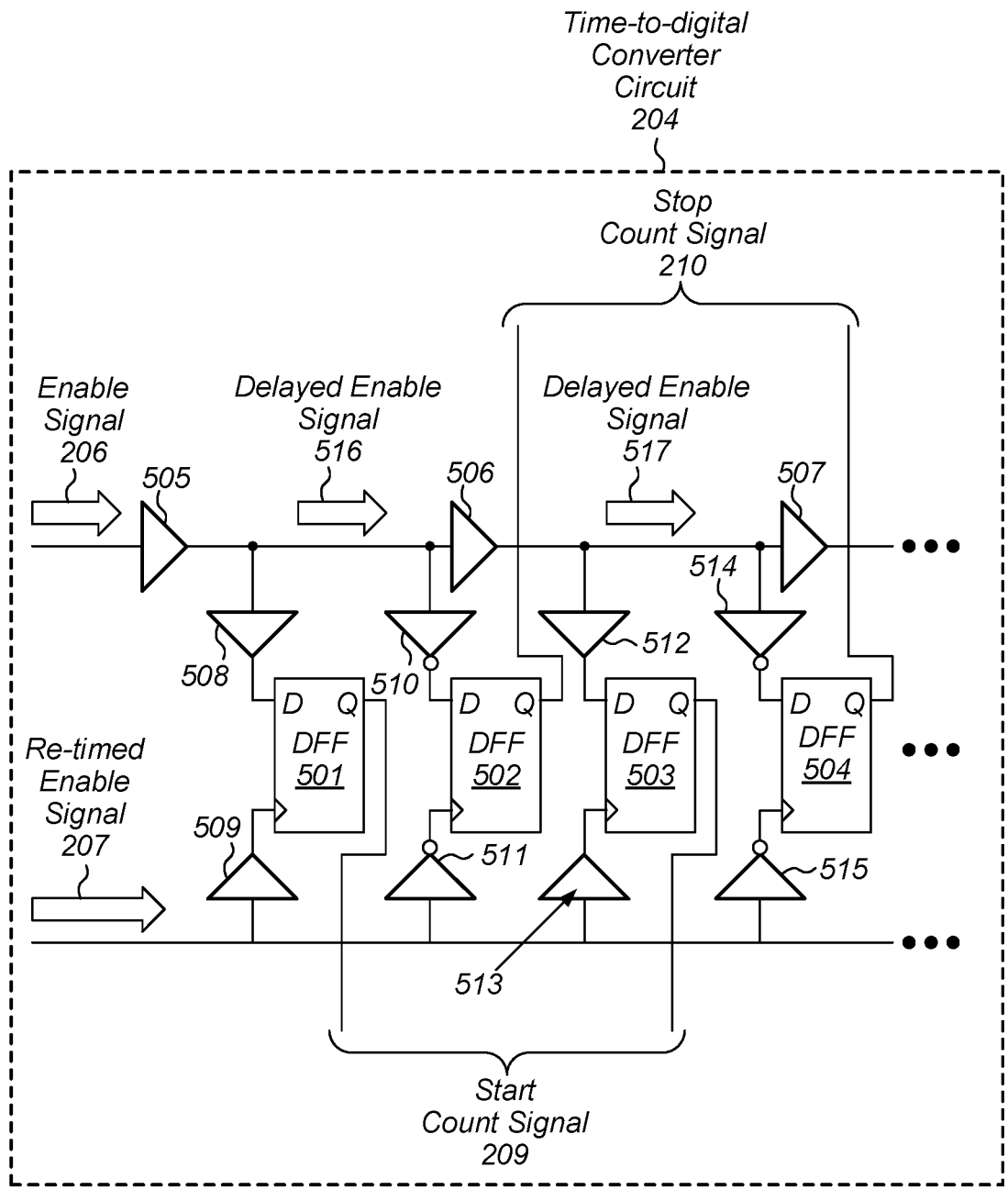
FIG. 5 illustrates a block diagram of a time-to-digital converter circuit.

Turning to FIG. 5, a block diagram of TDC circuit 204 is depicted. As illustrated, TDC circuit 204 includes flip-flop circuits (denoted as 'DFF 501," "DFF 502," "DFF 503," and "DFF 504"), buffer circuits 505-509, 512, and 513, and inverter circuits 510, 511, 514, and 515.

Enable signal 206 is coupled to an input of buffer circuit 505, whose output is coupled to the respective inputs of buffer circuits 506 and 508, and inverter circuit 510. An output of buffer circuit 508 is coupled to the D-input of DFF 501, and an output over inverter circuit 510 is coupled to the D-input of DFF 502. It is noted that buffer circuit 505 generates a delayed version of enable signal 206.

An output of buffer circuit 506 is coupled to the respective inputs of buffer circuits 507 and 512, and inverter circuit 514. An output of buffer circuit 512 is coupled to the D-input of DFF 503, and an output of inverter circuit 514 is coupled to the D-input of DFF 504. It is noted that buffer circuit 506 generates a delayed version of the output signal generated by buffer circuit 505, thereby generating a further delayed version of enable signal 206.

Re-timed enable signal 207 is coupled to the respective inputs of buffer circuits 509 and 513, and inverter circuits 511 and 515. An output of buffer circuit 509 is connected to the clock input of DFF 501, and an output of buffer circuit 513 is coupled to the clock input of DFF 503. An output of inverter circuit 511 is coupled to the clock input of DFF 502, and an output of inverter circuit 515 is coupled to the clock input of DFF 504.

On each rising of falling transition of re-timed enable signal 207, particular ones of flip-flop circuits 501-504, sample a state of a particular delayed version of enable signal 206 or its inverse. For example, on a rising transition of re-timed enable signal 207, DFF 501 samples a value of delayed enable signal 516, and DFF 503 samples a value of delayed enable signal 517. The outputs of DFF 501 and DFF 503 are used to generate start count signal 209 whose value is corresponds to a time difference between the rising transition of enable signal 206 and re-timed enable signal 207.

In a similar fashion, on each falling transition of re-timed enable signal 207, DFF 502 samples a value of an inverted version of delayed enable signal 516, and DFF 504 samples a value of an inverted version of delayed enable signal 517. The outputs of DFF 502 and DFF 504 are used to generate stop count signal 210. In various embodiments, a value of stop count signal 210 may correspond to a time difference between the falling transitions of enable signal 206 and re-timed enable signal 207. By employing start count signal 209 and stop count signal 210, control circuit 205 may more accurately determine a frequency of oscillator signal 103, thereby improving a prediction of a next value of code signal 105, which may reduce an overall time to calibrate voltage-controlled oscillator circuit 101.

Flip-flop circuits 501-504 may be particular embodiments of D-type flip-flop circuits (referred to as "DFFs" or "D flip-flops"), configured to sample and hold a value of an input signal using a timing signal. It is noted that although only four flip-flop circuits are depicted in the embodiment illustrated in FIG. 5, in other embodiments, any suitable number of flip-flop circuits may be employed.

Figure 6:
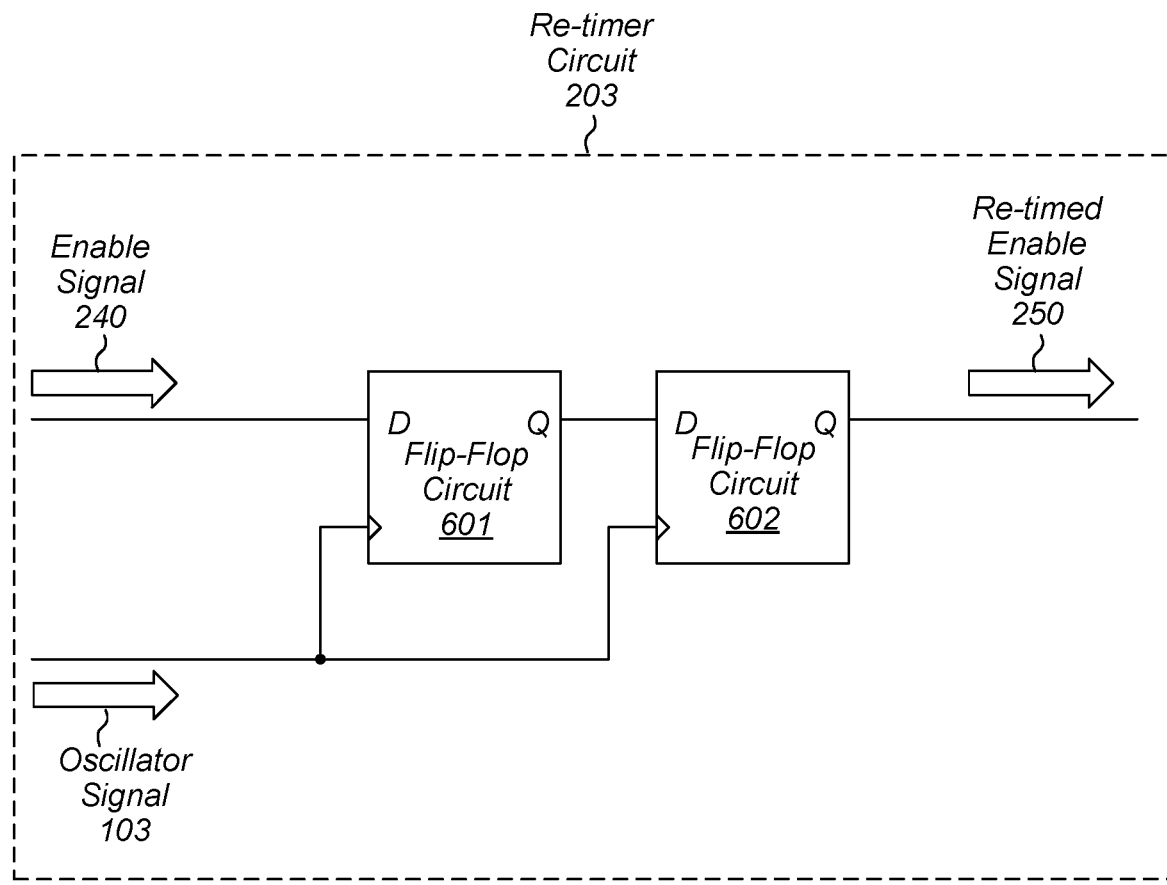
FIG. 6 illustrates a block diagram of an embodiment of a re-timer circuit.

Turning to FIG. 6, an embodiment of re-timer circuit 202 is depicted. As illustrated, re-timer circuit 202 includes flip-flop circuits 601 and 602. In various embodiments, flip-flop circuits 601 and 602 may be particular embodiments of D-type flip-flop circuits (referred to as "DFFs" or "D flip-flops"), configured to sample and hold a value of an input signal using a timing signal.

Flip-flop circuit 601 is configured to receive enable signal 240 at its data input, and is configured to receive oscillator signal 103 at its clock input. An output of flip-flop circuit 601 is coupled to an input of flip-flop circuit 602, which is also configured to receive oscillator signal 103 at its clock input. Flip-flop circuit 602 is further configured to generate re-timed enable signal 250 using the output of flip-flop circuit 601 and oscillator signal 103.

Figure 7:
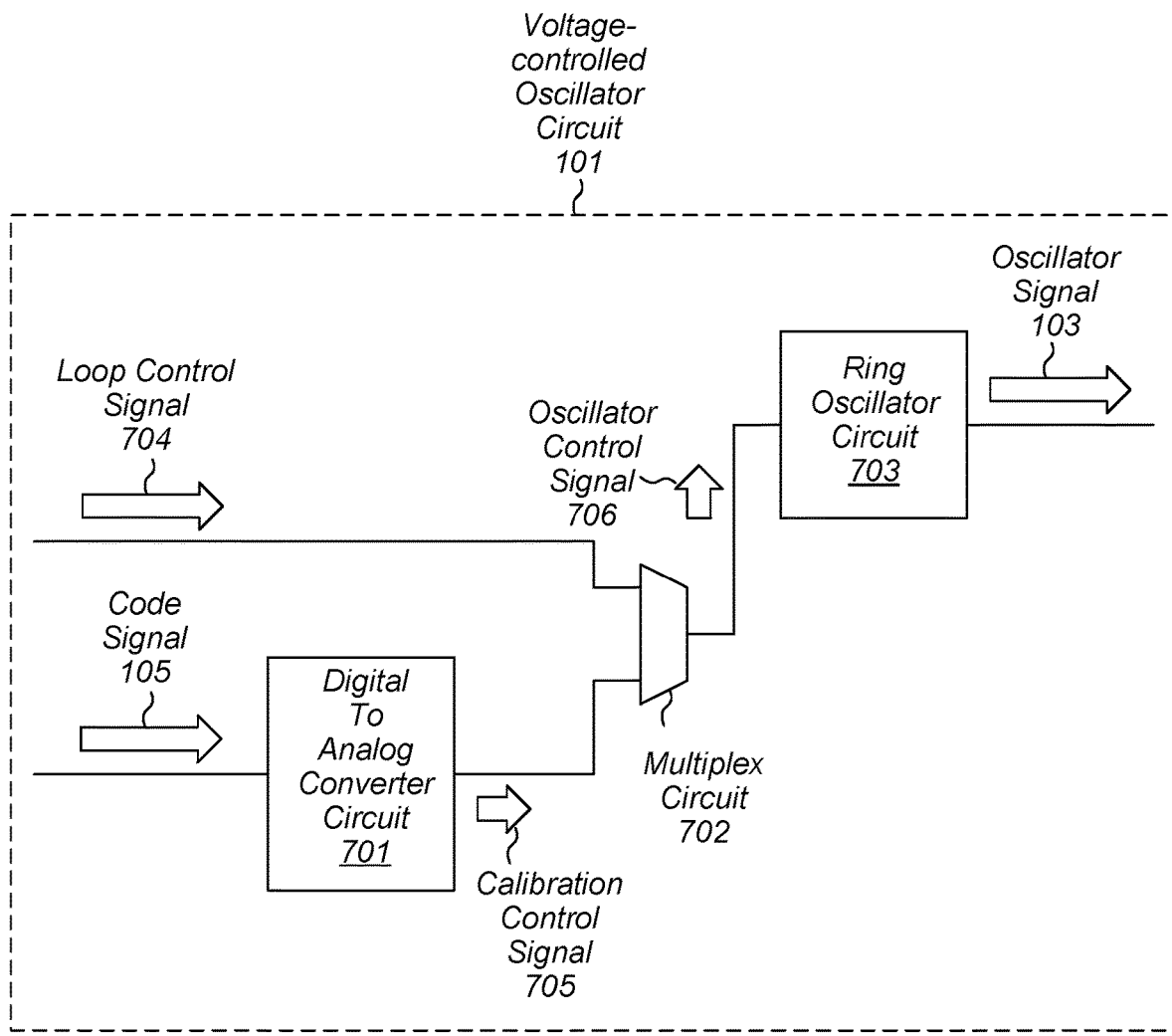
FIG. 7 illustrates a block diagram of an embodiment of a voltage-controlled oscillator.

Turning to FIG. 7, a block diagram of an embodiment of voltage-controlled oscillator circuit 101 is depicted. As illustrated, voltage-controlled oscillator circuit 101 includes digital-to-analog converter circuit 701, multiplex circuit 702, and ring oscillator circuit 703.

Digital-to-analog converter circuit 701 is configured to generate calibration control signal 705 using code signal 105. As mentioned above, code signal 105 may include a plurality of bits, and digital-to-analog converter circuit 701 may be configured to generate calibration control signal 705 such that a magnitude of calibration control signal 705 is based, at least in part, of respective values of the plurality of bits include in code signal 105. For example, in some cases, a voltage level of calibration control signal 705 may be determined used the plurality of bits included in code signal 105.

In various embodiments, digital-to-analog converter circuit 701 may be a particular embodiment of a switched resistor digital-to-analog converter circuit. In other embodiments, digital-to-analog converter circuit 701 may employ switched current sources, switched capacitors, or any other suitable type of circuit configured to convert a plurality of bits into an analog signal.

Multiplex circuit 702 is configured to select between loop control signal 704 and calibration control signal 705 to generate oscillator control signal 706. In various embodiments, multiplex circuit 702 may select calibration control signal 705 in response to an initiation of a calibration mode. It is noted that loop control signal 704 may, in some embodiments, correspond to an analog control signal generated by a phase-locked loop or other suitable circuit.

In some embodiments, multiplex circuit 702 may include one or more transmission gate circuits configured to selectively pass analog signals. In some cases, such transmission gates circuits may be wired together in a wired-OR fashion, and may include multiple p-channel and n-channel complementary metal-oxide semiconductor field-effect transistors, or other suitable transconductance devices.

Ring oscillator circuit 703 is configured to generate oscillator signal 103 using oscillator control signal 606. In various embodiments, ring oscillator circuit 703 may vary a frequency of oscillator signal 103 based, at least in part, on a magnitude of oscillator control signal 706. For example, ring oscillator circuit 703 may be configured to generate oscillator signal 103, where the frequency of oscillator signal 103 is based, at least in part, on a voltage level of oscillator control signal 706.

In various embodiments, ring oscillator circuit 703 may include a plurality of inverting amplifier circuits arranged in a daisy chain fashion. In some cases, a gain of a given one of the inverting amplifier circuits may be base, at least in part, on a magnitude of oscillator control signal 706. For example, the inverting amplifier circuit may include a current-starved inverter circuit, whose operating point is based on a voltage level of oscillator control signal 706. As used herein, a current-starved inverter circuit refers to an inverter circuit whose supply voltage or current is limited in to reduce a switching time of the inverter circuit. By adjusting how much a ring of current starved inverter circuits are "starved" for supply voltage or current, a frequency of signal traveling through the ring may be adjusted.

Although a ring oscillator circuit is depicted in the embodiment illustrated in FIG. 7, in other embodiments, different oscillator circuits may be employed. For example, in some cases, an inductor/capacitor oscillator circuit (commonly referred to as an "LC oscillator circuit") may be employed. In such cases, a voltage level of oscillator control signal 706 may adjust a value of variable capacitors, e.g., varactors, included in the oscillator circuit to change the frequency of oscillator signal 103.

Structures, such as those shown in FIGS. 2-6, for calibrating a voltage-controlled oscillator signal may be referred to using functional language. In some embodiments, these structures may be described as including "a means for generating an oscillator signal," "a means for, in response to an activation of a calibration mode, performing an iterative calibration operation on the voltage-controlled oscillator to generate a final value of a code signal," "a means for determining, over a particular period of time, a number of pulses included in the oscillator signal," and "a means for determining a particular value for the code signal using the number of pulses included in the oscillator signal, a first previous value of the code signal, and a slope of an error function between the first previous value of the code signal and a second previous value of the code signal," and "a mean for modifying a frequency of the oscillator signal using a given value of the code signal."

The corresponding structure for "means for generating a oscillator signal" is ring oscillator circuit 603 and its equivalents. The corresponding structure for "means for, in response to an activation of a calibration mode, performing an iterative calibration operation on the voltage-controlled oscillator to generate a final value of a code signal" is counter circuit 201, re-timer circuit 202, TDC circuit 204, counter circuit 203, and control circuit 205 and their equivalents. Counter circuit 203, and its equivalents, is the corresponding structure for "means for determining, over a particular period of time, a number of pulses included in the oscillator signal." The corresponding structure for "mean determining a particular value for the code signal using the number of pulses included in the oscillator signal, a first previous value of the code signal, and a slope of an error function between the first previous value of the code signal and a second previous value of the code signal" is counter circuit TDC circuit 204, counter circuit 203, and control circuit 204. The corresponding structure for "a mean for modifying a frequency of the oscillator signal using a given value of the code signal" is digital-to-analog converter circuit 701, multiplex circuit 702, and ring oscillator circuit 603, and their equivalents.

Figure 8:
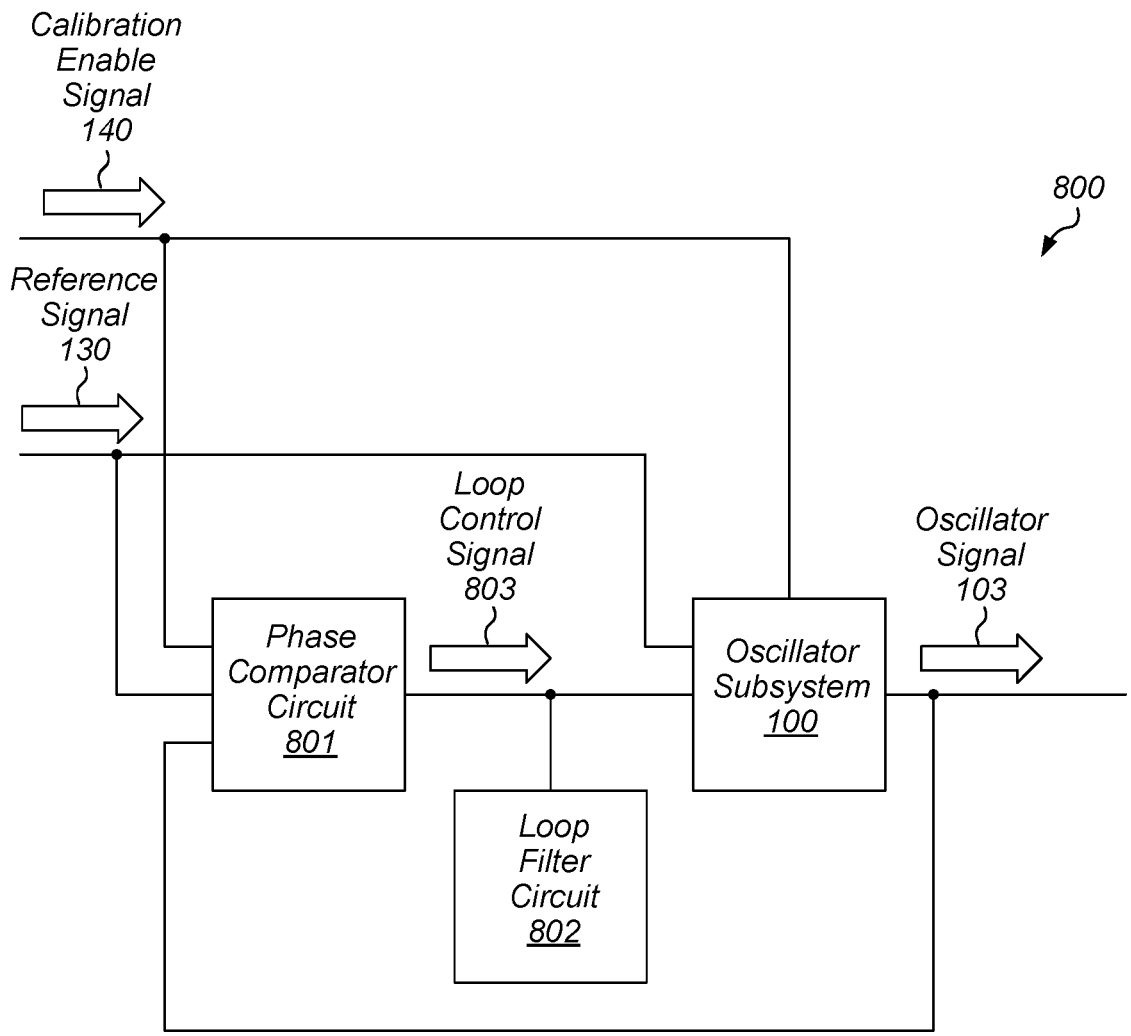
FIG. 8 is a block diagram of a phase-locked loop circuit.

Turning to FIG. 8, a block diagram of a phase-locked loop circuit is depicted. As illustrated, phase-locked loop circuit 800 includes phase comparator circuit 801, loop filter circuit 802, and oscillator subsystem 100 as depicted in the embodiment of FIG. 1.

Phase comparator circuit 801 is configured to generate loop control signal 803 using calibration enable signal 140, reference signal 130, and oscillator signal 103. In some cases, phase comparator circuit 801 may be configured to generate loop control signal 803 such that a voltage level of loop control signal 803 is based, at least in part, on a phase difference between reference signal 130 and oscillator signal 103.

During calibration operation, phase comparator circuit 801 may be disabled. For example, in response to an assertion of calibration enable signal 140, phase comparator circuit 801 may be configured to enter a low-power state, as well as set loop control signal 803 to a particular voltage level or allow loop control signal 803 to float. In some embodiments, phase comparator circuit 801 may be left active during calibration operation.

Phase comparator circuit 801 may, in various embodiments, include multiple flip-flop circuits, or MOSFETs, or other transconductance devices configured to generate loop control signal 803 such that a frequency of loop control signal 803 is a difference of the respective frequencies of reference signal 130 and oscillator signal 103. In some cases, phase comparator circuit 801 may generate a series of pulses, whose frequency is based on the difference of the respective frequencies of reference signal 130 and oscillator signal 103. The series of pulses may be used, in conjunction with a charge pump, so selectively source or sink charge from the node through which loop control signal 803 propagates, thereby adjusting a voltage level of loop control signal 803.

Loop filter circuit 802 may be configured to filter, or attenuate, one or more frequency components included in loop control signal 803. In some embodiments, loop filter circuit 802 may include one or more resistors, capacitors, inductors, or other passive components, configured to generate a low impedance to ground at particular frequencies.

As described above, calibration control circuit 102 may, in various embodiments, employ a Newton search method to determine a final value of code signal 105. To further illustrate how the Newton search method may be employed, a graphical depiction of a Newton search method is illustrated in FIGS. 9A and 9B.

Figure 9A:
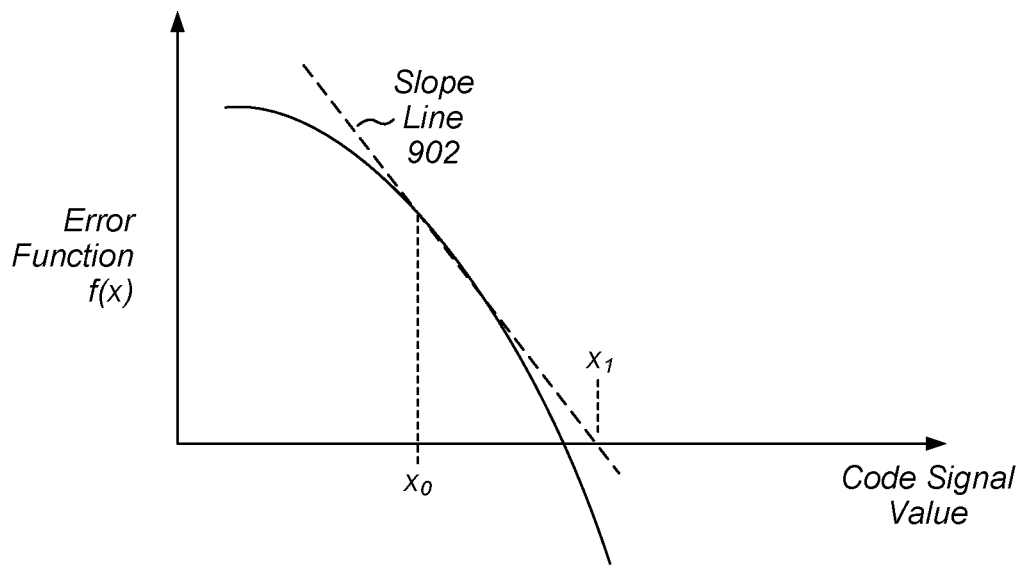
FIG. 9A is a graphical depiction of an initial iteration of a Newton search algorithm.
Figure 9B:
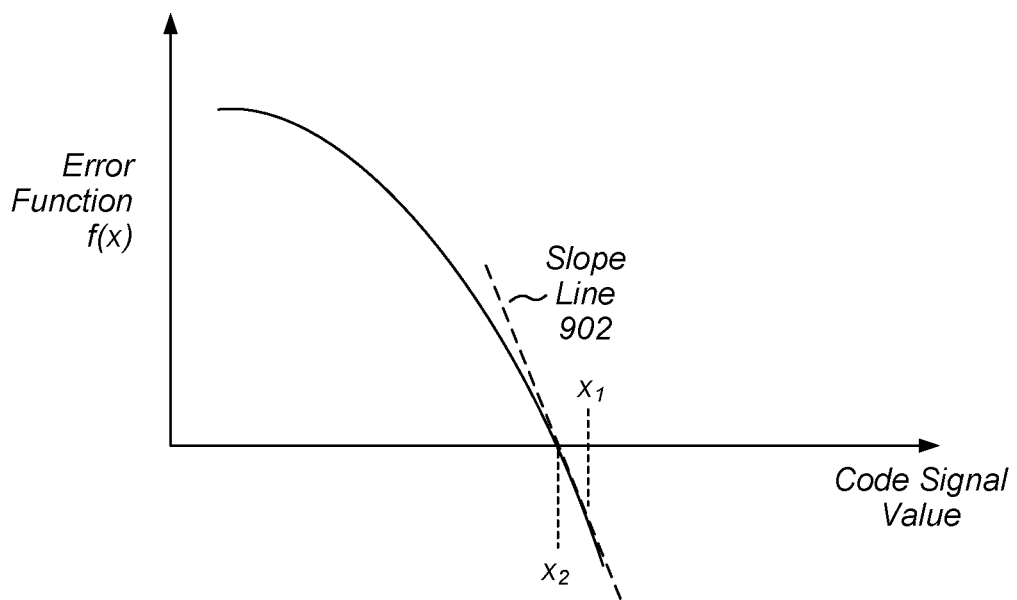
FIG. 9B is a graphical depicting of a subsequent iteration of a Newton search algorithm.

Turning to FIG. 9A, a graphical depiction of an initial iteration of a Newton search method is illustration. Code value x0 may be an initial value for the Newton search method that may be selected based on various criteria. For example, the initial value may be based on a desired frequency for voltage-controlled oscillator circuit 101, a voltage level of a power supply, or any other suitable criterion.

A cost function (also referred to as an "error function"), $f(x)$, is evaluated at x0. Using the value of the error function at x0, a next value of code signal 105 may be determined using slope line 901 according to Equation 2. During the initial iteration, slope line 901 may be a predefined slope value (labeled as "preslope").

$$x_1 = x_0 - \frac{f(x_0)}{\text{preslope}} \qquad (2)$$

A graphical depiction of a subsequent iteration is illustrated in FIG. 9B. In this case, the next value of code signal 105, x2, is determined using the previous value of code signal 105 x1. In this case, the value of slope line 902 is determined using the two previous values of code signal 105, i.e., x0 and x1. The next value for code signal 105 may be determined using Equation 3.

$$x_{n+1} = x_n - \frac{f(x_n) \cdot (x_n - x_{n-1})}{f(x_n) - f(x_{n-1})} \qquad (3)$$

By employing such a Newton search method, code signal 105 may converge in a quadratic fashion. Traditional binary search methods may converge in a linear fashion. For example, in systems with a 5-bit code signal one calibration step may take 1.6 us. A binary search may require five steps, taking 8 us, while a Newton search may require only 2 to 3 steps, resulting in a time of 3.2 us to 4.8 us. It is noted that the graphs illustrated in FIGS. 9A and 9B are merely examples. In other embodiments, the general shape of the error function and the slope of the error function at different values of code signal 105 may vary.

As described above, a modified binary search method, i.e., quick binary, may be used to determine a value for code signal 105 that results in the frequency of oscillator signal 103 achieving a desired frequency. The use of quick binary may, in various embodiments, reduce an amount of time to determine the desired value for code signal 105.

Figure 10:
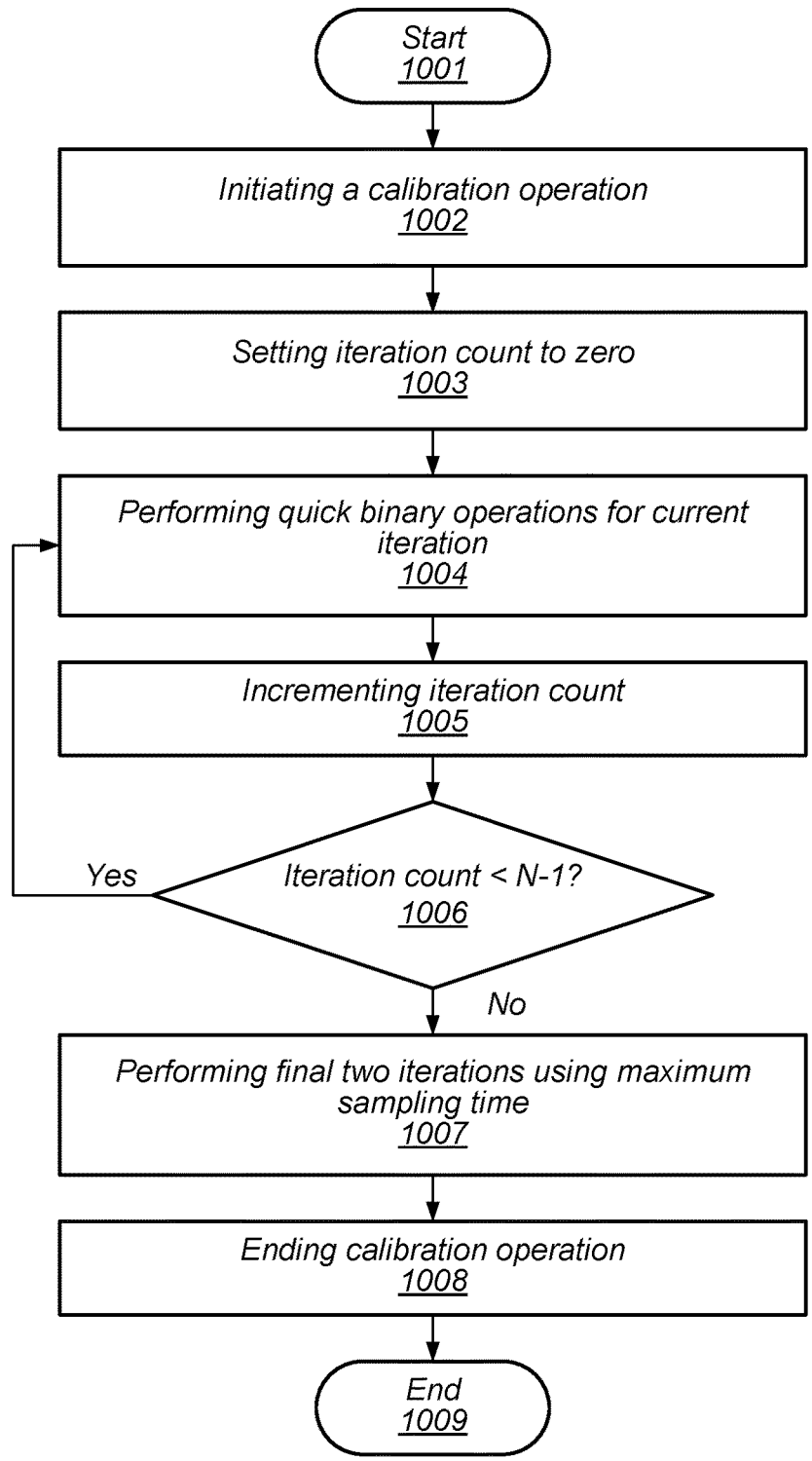
FIG. 10 illustrates a flow diagram depicting an embodiment of a method for performing a calibration operation using quick binary.

Turning to FIG. 10, a flow diagram depicting a voltage-controlled oscillator circuit calibration operation that employs quick binary is illustrated. The method begins in block 1001.

The method includes initiating a calibration operation (block 1002). As previously described, initiating the calibration operation may include disabling the feedback of phase-locked loop circuit 800, and directly driving voltage-controlled oscillator circuit 101 using code signal 105.

Once the calibration operation has been initiated, the method includes setting an iteration count to zero (block 1003). In various embodiments, a counter or other suitable circuit may be set to a zero value. The number of iterations that will be performed during the calibration operation may be based, at least in part, on a number of bits includes in code signal 105.

Having set the iteration count, the method includes performing quick binary operations (block 1004). As described below in more detail, the quick binary operations include determining a sampling time for the current iteration. As used and described herein, the sampling time refers to a period of time that pulses included in oscillator signal 103 are counted. The determined sampling time may, in some embodiments, be less than a maximum sampling time. By reducing the sampling time for quick binary iterations, the overall duration of the calibration operation may be reduced. It is noted that by reducing the sampling time, error may be introduced into the determination of the frequency.

Upon completing the quick binary operations, the iteration count is incremented (block 1005). The method may then depend on a value of the iteration count (block 1006). If the iteration count is less than or equal to N−2 (where N is a number of bits included in code signal 105), then the method proceeds from block 1004 as described above.

Alternatively, if the iteration count is greater than N−2, then the method includes performing the last two iteration using the maximum sampling time (block 1007). It is noted that the last two iterations are optional. In some cases, the first N−1 iterations may yield a result that is of sufficient accuracy depending on the particular phase-locked loop circuit. By using the maximum sampling time, the accuracy of the last two iterations is increased over that of the first N−1 iterations, providing an increase level of accuracy in a final value for code signal 105.

Once the last two iterations have been completed, the method includes ending the calibration operation (block 1008). As the calibration operation is ended, the frequency of oscillator signal 103 is close to the desired frequency. The feedback loop of phase-locked loop circuit 800 may then be re-enabled, allowing the phase-locked loop circuit 800 to maintain the frequency of oscillator signal 103 at the desired frequency. The method concludes in block 1009.

Figure 11:
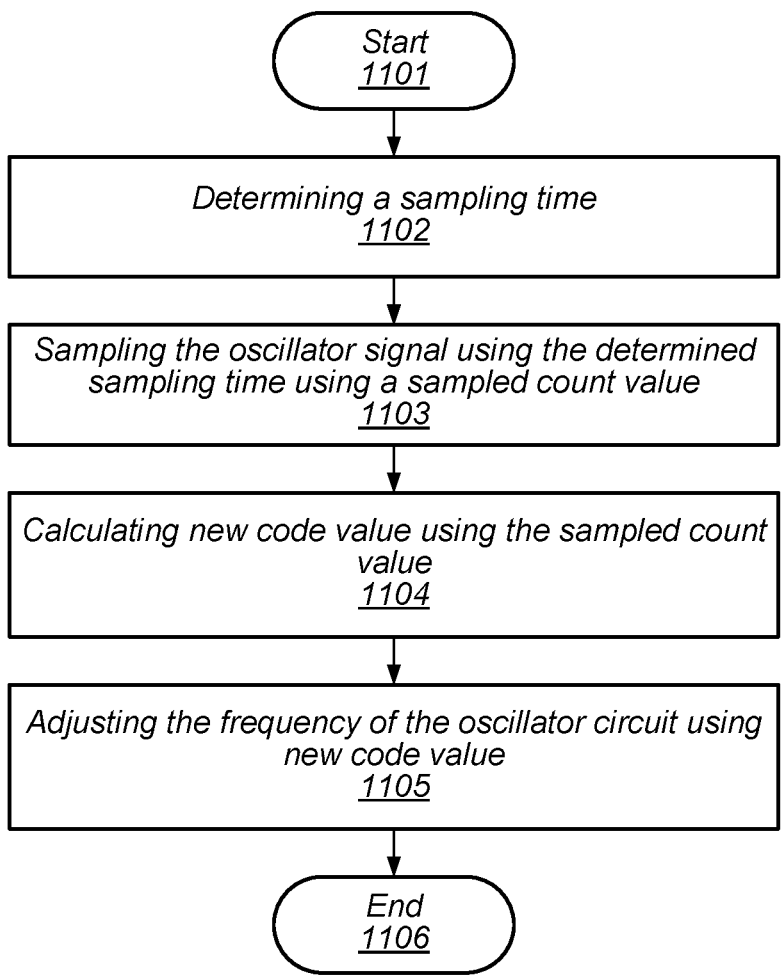
FIG. 11 illustrates a flow diagram depicting an embodiment of a method for performing quick binary operations.

Turning to FIG. 11, a flow diagram depicting an embodiment of a method for performing quick binary operations is illustrated. The method, which begins in block 1101, may be corresponding to block 1004 as depicted in the flow diagram of FIG. 10.

The method includes determining a sampling time (block 1102). In some embodiments, the sampling time is measure in a number of cycles of a reference clock signal, reference signal 405, for example. When sampling a signal, such as the oscillator signal, the frequency of the reference clock and the number of cycles over which the sampling is performed affect the resolution of the measurement. In general, the longer the sampling time, the higher the resolution of the measurement. In various embodiments, the resolution can be calculated using Equation 4, where $freq_{ref\_clk}$ is the frequency of the reference clock signal and sampling cycles is the sampling time in cycles.

$$\text{resolution} = x_n - \frac{freq_{ref\_clk}}{\text{sampling cycles}} \quad (4)$$

As noted above, reducing the sampling time introduces additional error into the measurement of the frequency of the oscillator signal. For a given iteration, the sampling time is selected such that a minimum sampling time is selected such that a difference in frequency between two adjacent code values can be detected when error is taken into account.

The method further includes sampling the oscillator signal using the determined sampling time to generate a sampled count value (block 1103). In some embodiments, the method may include scaling, using a scale value, the sampled count value to generate a scaled count value. The scale value may, in some cases, be determined using the determined sampling time and the reference clock signal.

The method also includes calculating a new code value using the sampled count value (block 1104). As described above, calculating the new code value may include determining a difference between a value of count value 404 for the current iteration and a target count value that corresponds to oscillator signal 103 being at the desired frequency. The method may also include, retrieving, from a storage circuit, one or more constants relating to characteristics of oscillator subsystem 100, and calculating the new code value using the one or more constants.

The method further includes adjusting the frequency of the oscillator circuit using the new code value (block 1105). In various embodiments, the new code value may be used to adjust amount of capacitance between an input node and an output node included in the oscillator circuit. In other cases, the new code value may be used to change an amount of current being supplied to a ring oscillator circuit included in the oscillator circuit. It is noted that, in some embodiments, the code value may be converted to an analog signal prior to being used to adjust the frequency of the oscillator circuit. The method concludes in block 1106.

Although the use of quick binary operations has been described in the context of performing a calibration operation on a voltage-controlled oscillator circuit, it is noted that such quick binary operations are not limited to such an application. For example, quick binary operations may be used in conjunction with the operation of an analog-to-digital converter circuit, where initial iterations sample an analog voltage level with reduced accuracy to improve speed. Alternatively, quick binary operations may be used in other computer-based successive approximation techniques such as determining reciprocals or square roots.

Figure 12:
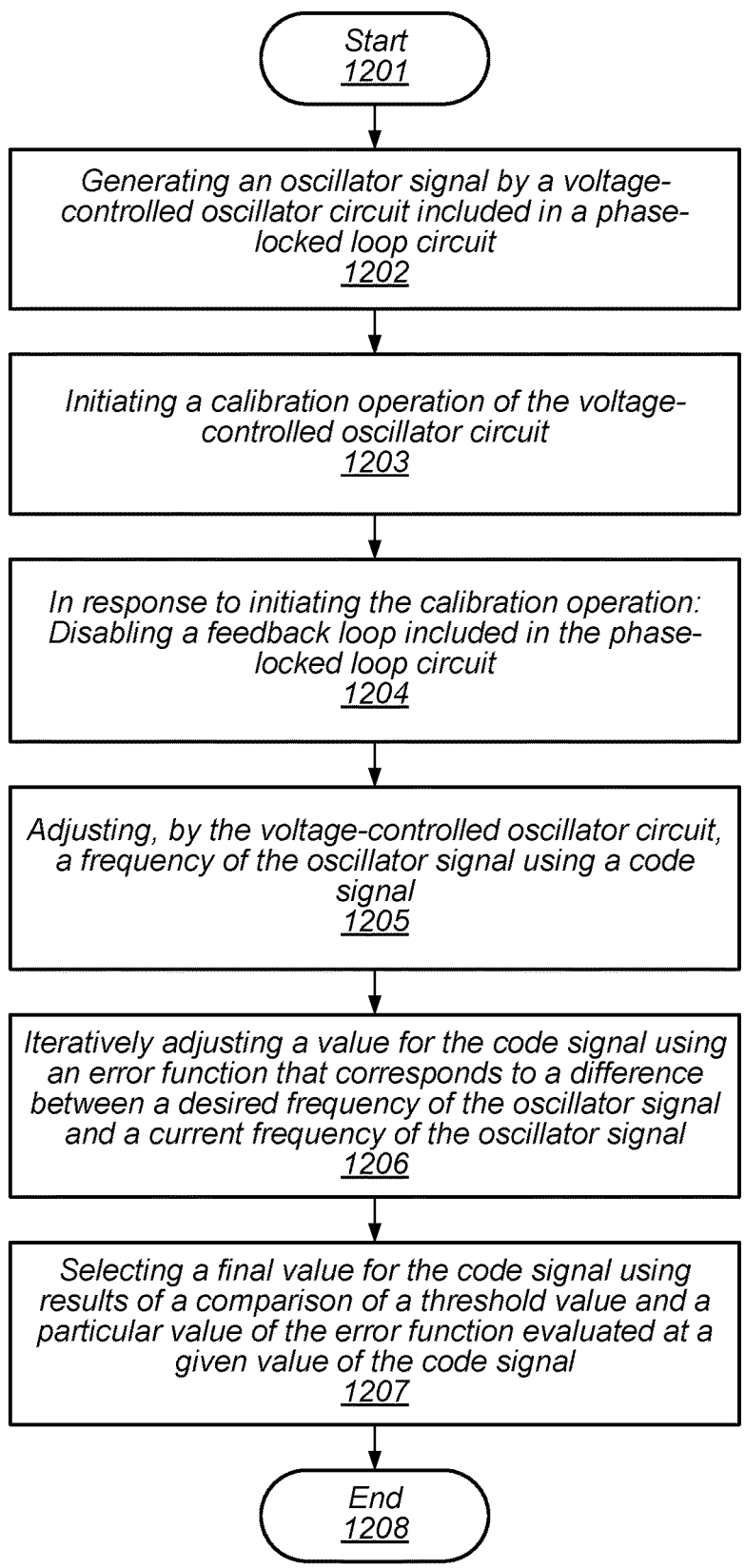
FIG. 12 illustrates a flow diagram depicting an embodiment of a method for calibrating a voltage-controller oscillator circuit.

Turning to FIG. 12, a flow diagram depicting an embodiment of a method for calibrating a voltage-controlled oscillator is illustrated. The method, which may be applied to oscillator subsystem 100, begins in block 1201.

The method includes generating an oscillator signal by a voltage-controlled oscillator circuit included in a phase-locked loop circuit (block 1202).

The method further includes initiating a calibration operation of the voltage-controlled oscillator circuit (block 1203). In various embodiments, the method may include initiating the calibration operation in response to activating the phase-locked loop circuit from an inactive state. The method may also include, in some cases, initiating the calibration operation in response to changing a target frequency for the phase-locked loop circuit.

Due to a possible lengthy settling time for the analog control loop of the phase-locked loop, the analog control loop may be disabled during calibration operations, instead relying on the calibration circuit to more rapidly tune the voltage-controlled oscillator circuit to the desired frequency. In such cases, the method also includes, in response to initiating the calibration operation, disabling a feedback loop included in the phase-locked loop circuit (block 1204). By disabling the analog control loop in favor of the aforementioned calibration control circuit, the time needed to tune the voltage-controlled oscillator circuit may, in various embodiments, be reduced.

The method further includes adjusting, by the voltage-controlled oscillator circuit, a frequency of the oscillator signal using a code signal (block 1205). In some embodiments, the code signal includes a plurality of bits, and adjusting, by the voltage-controlled oscillator circuit, the frequency of the oscillator signal using the code signal may include generating a control signal for the voltage-controlled oscillator circuit, where a voltage level of the control signal is based, at least in part, on the plurality of bits.

The method also includes iteratively adjusting a value of the code signal using an error function that corresponds to a difference between a desired frequency of the oscillator signal and a current frequency of the oscillator signal (block 1206). As describe above, a Newton search method may be employed as part of the iteratively adjusting the value of the code signal. In such cases, the slope of the error function at various values of the code signal may be used to determine a next value for the code signal.

In some embodiments, iteratively adjusting the value of the code signal includes determining, over a particular period of time, a number of pulses included in the oscillator signal, and determining a particular value for the code signal using the number of pulses included in the oscillator signal, a first previous value of the code signal, and a slope of an error function between the first previous value of the code signal and a second previous value of the code signal.

As described above, a reference signal may be employed to determine a duration of the particular period of time used to count the number of pulses in the oscillator signal. In such cases, the method may include generating an enable signal, where a duration of the enable signal is base, at least in part, on a particular number of pulses of reference signal.

The method further includes selecting a final value for the code signal using results of a comparison of a threshold value and a particular value of the error function evaluated at a given value of the code signal (block 1207). The method concludes in block 1208.

Figure 13:
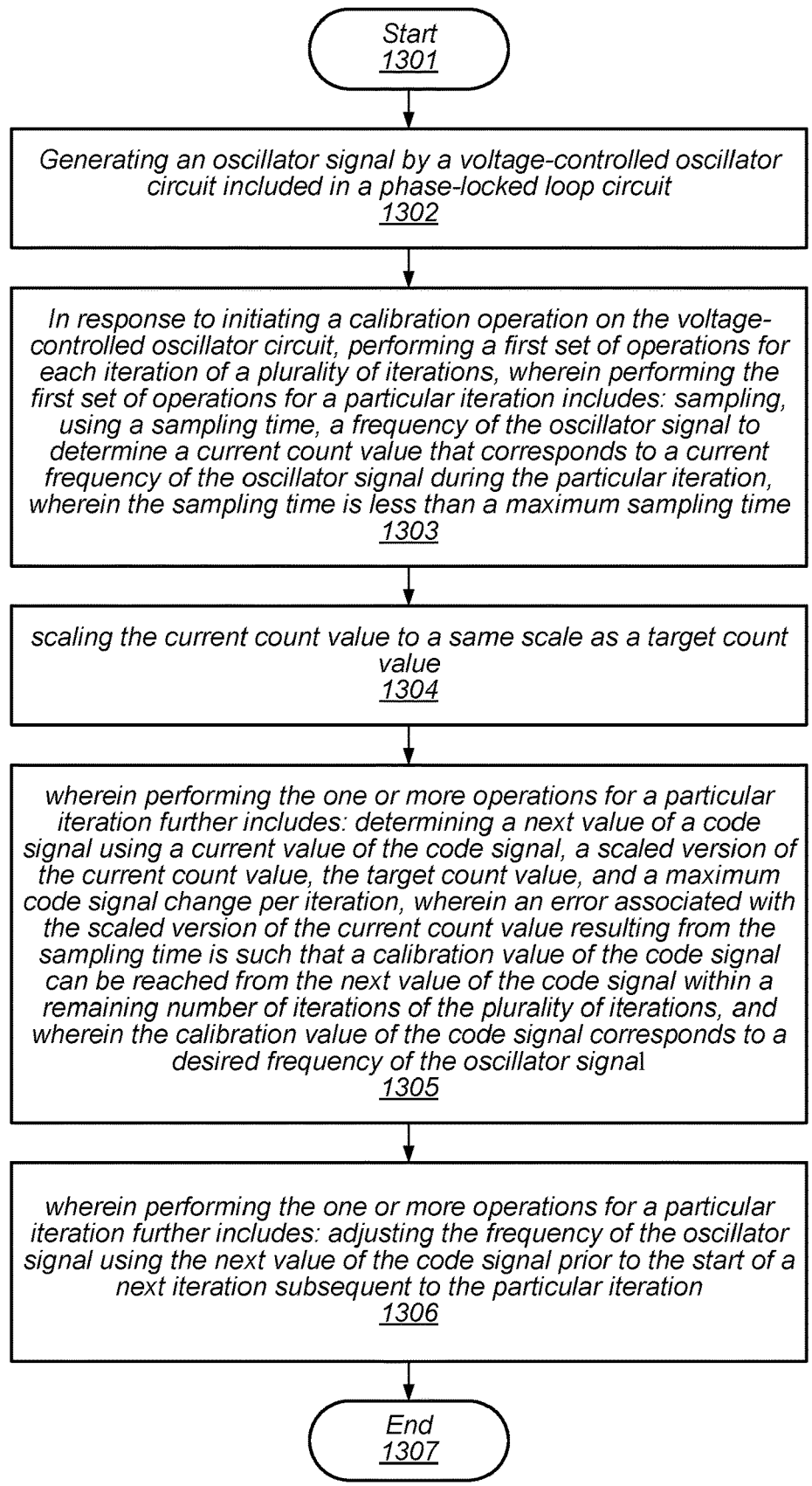
FIG. 13 illustrates a flow diagram depicting an embodiment of another method for calibrating a voltage-controlled oscillator circuit.

Turning to FIG. 13, a flow diagram depicting an embodiment of a method for calibrating a voltage-controlled oscillator using quick binary is illustrated. The method, which may be applied to oscillator subsystem 100, begins in block 1301.

The method includes generating an oscillator signal by a voltage-controlled oscillator circuit included in a phase-locked loop circuit (block 1302).

The method also includes, in response to initiating a calibration operation on the voltage-controlled oscillator circuit, performing a first of operations for each iteration of a plurality of iterations, where performing the first set of operations includes sampling, using a sampling time, a frequency of the oscillator signal to determine a current count value that corresponding to a current frequency of the oscillator signal during the particular iteration, where the sampling time is less than a maximum sampling time (block 1303).

Performing the first set of operation may also include, according to the method, scaling the current count value to a same scale as a target count value (block 1304). For example, if the target count is 1000 when counting over 512 cycles and the sampling time for a particular iteration is 128 cycles, the current count value may be multiplied by a factor of 4 to make the scale of the current count value the same as the scale of the target count value.

According to the method, performing the first set of operations further includes determining a next value of a code signal using a current value of the code signal, a scaled version of the current count value, the target count value, and a maximum code signal change per iteration, where an error associated with the scaled version of the current count value resulting from the sampling time is such that a calibration value of the code signal can be reached from the next value of the code signal within a remaining number of iterations of the plurality of iterations (block 1305). In some embodiments, the calibration value of the code signal corresponds to a desired frequency of the oscillator signal.

In some cases, determining the next value of the code signal includes performing an operation using the current value of the code signal and a difference between the target count value and the scaled version of the current count value. For example, the operation may be addition, in which case, the current value of the code signal may be added to the difference between the target count value and the scaled version of the current count value. In other embodiments, the current value of the code signal may be combined with the difference between the target count value and the scaled version of the current count value using multiplication, division, or any other suitable operation. It is noted that the use of any combination of operators may be combined with a function to limit, or clamp, the change in the value of the code signal to a maximum code signal change within a given iteration.

Also, according to the method, performing the first set of operations further includes adjusting the frequency of the oscillator signals using the next value of the code signal prior to the start of a next iteration subsequent to the particular iteration (block 1306).

In various embodiments, performing the first set of operations may also include determining a new the sampling time for a next iteration subsequent to the particular iteration, where the new sampling time is equal to a minimal sampling time, or greater than the sampling time and less than the maximum sampling time, where the maximum sampling time is such that a difference in the frequency of the oscillator signal resulting from two adjacent values of the code signal can be detected.

In some embodiments, the method may also include, in response to completing a particular number of iterations, performing respective sets of operations for each iteration of a remaining number of iterations. In various embodiments, performing the respective sets of operations includes performing a first set of operations for a first iteration of the remaining iterations that includes: sampling, using the maximum sampling time, the frequency of the oscillator signal to determine a first count value, and determining a first next value of the code signal using the current value of the code signal, the first count value, and the target count value.

In some embodiments, performing the respective set of operations includes performing a second set of operations for a second iteration of the remaining number of iterations that includes: sampling, using the maximum sampling time, the frequency of the oscillator signal to determine a second count value, determining a second next value of the code signal using the second count value, and selecting a final value of the code signal from the first next value and the second next value of the code signal, where the final value of the code signal has a smallest error of the first next value and the second next value of the code signal. It is noted that in the first and second set of operations, the determined count values do not need to be scaled as the maximum sampling time is being used. The method concludes in block 1307.

Figure 14:
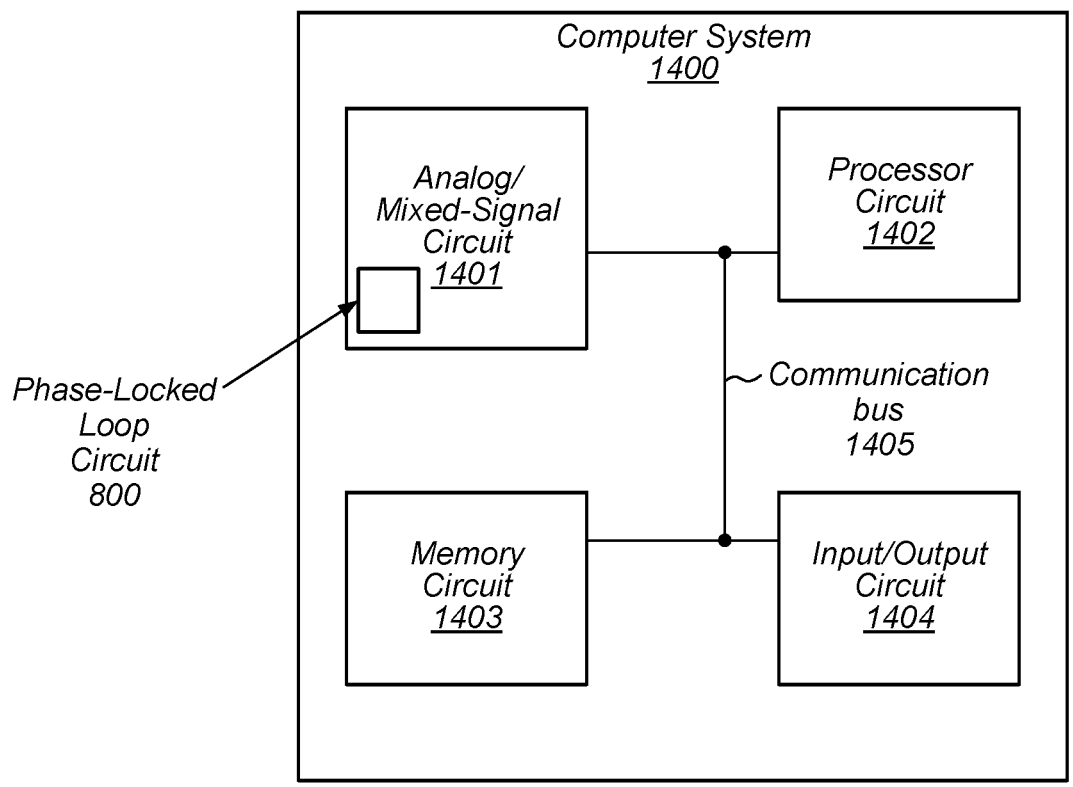
FIG. 14 is a block diagram of one embodiment of a computer system that includes a phase-locked loop circuit.

A block diagram of computer system is illustrated in FIG. 14. As illustrated embodiment, the computer system 1400 includes analog/mixed-signal circuits 1401, processor circuit 1402, memory circuit 1403, and input/output circuits 1404, each of which is coupled to communication bus 1405. In various embodiments, computer system 1400 may be a system-on-a-chip (SoC) and be configured for use in a desktop computer, server, or in a mobile computing application such as, a tablet, laptop computer, or wearable computing device.

Analog/mixed-signal circuits 1401 may include a crystal oscillator circuit, a phase-locked loop circuit 800, an analog-to-digital converter (ADC) circuit, and a digital-to-analog converter (DAC) circuit (all not shown). In other embodiments, analog/mixed-signal circuits 1401 may be configured to perform power management tasks with the inclusion of on-chip power supplies and voltage regulators.

Processor circuit 1402 may, in various embodiments, be representative of a general-purpose processor that performs computational operations. For example, processor circuit 1402 may be a central processing unit (CPU) such as a microprocessor, a microcontroller, an application-specific integrated circuit (ASIC), or a field-programmable gate array (FPGA).

Memory circuit 1403 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that in the embodiment of a computer system in FIG. 14, a single memory circuit is depicted. In other embodiments, any suitable number of memory circuits may be employed.

Input/output circuits 1404 may be configured to coordinate data transfer between computer system 1400 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1404 may be configured to implement a version of Universal Serial Bus (USB) protocol or IEEE 1394 (Firewire®) protocol.

Input/output circuits 1404 may also be configured to coordinate data transfer between computer system 1400 and one or more devices (e.g., other computing systems or integrated circuits) coupled to computer system 1400 via a network. In one embodiment, input/output circuits 1404 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1404 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a voltage-controlled oscillator configured to generate an oscillator signal;
    a calibration circuit configured, in response to an activation of a calibration mode, to perform an iterative calibration operation on the voltage-controlled oscillator to generate a final value of a code signal;
    wherein to perform a particular iteration of the iterative calibration operation, the calibration circuit is further configured to:
        determine, over a particular period of time, a number of pulses included in the oscillator signal;
        generate an enable signal whose value is based on a number of pulses of a reference signal; and
        determine a particular value for the code signal using the number of pulses included in the oscillator signal, the enable signal, a first previous value of the code signal, and a slope of an error function between the first previous value of the code signal and a second previous value of the code signal; and
    wherein the voltage-controlled oscillator is further configured to modify a frequency of the oscillator signal using a given value of the code signal.

2. The apparatus of claim 1, wherein the calibration circuit is further configured to re-time the enable signal to generate a re-timed enable signal.

3. The apparatus of claim 2, wherein the calibration circuit is further configured to:
    generate a start count signal using the enable signal and the re-timed enable signal, wherein a value of the start count signal corresponds to a difference in respective assertion times of the enable signal and the re-timed enable signal; and
    generate a stop count signal using the enable signal and the re-timed enable signal, wherein a value of the stop count signal corresponds to a difference in respective de-assertion times of the enable signal and the re-timed enable signal.

4. The apparatus of claim 3, wherein the calibration circuit is further configured to determine the particular value for the code signal using the number of pulses included in the oscillator signal, the first previous value of the code signal, the slope of an error function between the first previous value of the code signal and the second previous value of the code signal, and the start count signal and the stop count signal.

5. The apparatus of claim 1, wherein a value of the error function corresponds to a difference between a desired frequency of the oscillator signal and an actual frequency of the oscillator signal for the given value of the code signal.

6. A method, comprising:
generating an oscillator signal by a voltage-controlled oscillator circuit included in a phase-locked loop circuit;
initiating a calibration operation of the voltage-controlled oscillator circuit;
in response to initiating the calibration operation:
disabling a feedback loop included in the phase-locked loop circuit;
adjusting, by the voltage-controlled oscillator circuit, a frequency of the oscillator signal using a code signal;
iteratively adjusting a value of the code signal by:
determining, over a particular period of time, a number of pulses included in the oscillator signal;
determining a particular value for the code signal using the number of pulses included in the oscillator signal, a first previous value of the code signal, and a slope of an error function between the first previous value of the code signal and a second previous value of the code signal, wherein the
error function corresponds to a difference between a desired frequency of the oscillator signal and a current frequency of the oscillator signal; and
selecting a final value for the code signal using results of a comparison of a threshold value and a particular value of the error function evaluated at a given value of the code signal.

7. The method of claim 6, further comprising, initiating the calibration operation in response to activating the phase-locked loop circuit from an inactive state.

8. The method of claim 6, further comprising, initiating the calibration operation in response to changing a target frequency for the phase-locked loop circuit.

9. The method of claim 6, further comprising generating an enable signal, wherein a duration of the enable signal is based, at least in part, on a particular number of pulses of a reference signal.

10. The method of claim 9, further comprising:
generating a re-timed version of the enable signal;
determining a first count value corresponding to a first difference in time between a rising transition of the enable signal and a rising transition of the re-timed version of the enable signal;
determining a second count value corresponding to a second difference in time between a falling transition of the enable signal and a falling transition of the re-timed version of the enable signal; and
determining the particular value for the code signal using the number of pulses included in the oscillator signal, the first previous value of the code signal, the slope of the error function between the first previous value of the code signal and a second previous value of the code signal, the first count value and the second count value.

11. The method of claim 6, wherein the code signal includes a plurality of bits, and wherein adjusting, by the voltage-controlled oscillator circuit, the frequency of the oscillator signal using the code signal includes generating a control signal for the voltage-controlled oscillator circuit, wherein a voltage level of the control signal is based, at least in part, on the plurality of bits.

12. An apparatus, comprising:
a voltage-controlled oscillator circuit configured to generate an oscillator signal;
a first counter circuit configured, in response to an activation of a calibration mode, generate an enable signal using a reference signal;
a second counter circuit configured, in response to an assertion of the enable signal, generate a pulse count signal;
a time-to-digital converter circuit configured to generate a start count signal and a stop count signal, wherein the start count signal corresponds to an assertion of the enable signal and the stop count signal corresponds to a de-assertion of the enable signal; and
a control circuit configured to:
iteratively generate a plurality of values for a code signal using the pulse count signal, the start count signal, and the stop count signal; and
select a final value for the code signal using results of a comparison of a threshold value and a particular value of an error function evaluated at a given value of the code signal, wherein a given value of the error function corresponds to a difference between a desired frequency of the oscillator signal and a current frequency of the oscillator signal; and
wherein the voltage-controller oscillator circuit is further configured, during the calibration mode, to adjust a frequency of the oscillator signal using the code signal.

13. The apparatus of claim 12, wherein the first counter circuit is further configured to generate the enable signal based, at least in part, on a particular number of pulses of the reference signal.

14. The apparatus of claim 12, further comprising a re-timer circuit configured to sample the enable signal using the oscillator signal to generate a re-timed enable signal.

15. The apparatus of claim 14, wherein to generate the start count signal, the time-to-digital converter circuit is further configured to sample a plurality of delayed versions of the enable signal in response to a detection of an asserted of the re-timed enable signal.

16. The apparatus of claim 15, wherein to generate the stop count signal, the time-to-digital converter circuit is further configured to sample a plurality of delayed versions of an inverse of the enable signal in response to a detection of a de-assertion of the re-timed enable signal.

17. The apparatus of claim 12, wherein to adjust the frequency of the oscillator signal, the voltage-controller oscillator circuit is further configured generate a calibration control signal, wherein a voltage level of the calibration control signal is based, at least in part, on a particular value of the code signal.

18. The apparatus of claim 17, wherein the voltage-controlled oscillator circuit is further configured to select one of a loop control signal or the calibration control signal to generate an oscillator control signal, wherein the voltage-controlled oscillator circuit includes a ring oscillator circuit configured to generate the oscillator signal using the oscillator control signal.

19. A method, comprising:
generating an oscillator signal by a voltage-controlled oscillator circuit included in a phase-locked loop circuit;
in response to initiating a calibration operation on the voltage-controlled oscillator circuit;
disabling a feedback loop of the phase-locked loop circuit;
performing a first set of operations for a particular number of iterations of a plurality of iterations using a corresponding plurality of sampling times, wherein performing the first set of operations for a particular iteration includes:
determining, using a frequency of the oscillator signal from a previous iteration of the plurality of iterations, a particular sampling time of the corresponding plurality of sampling times that corresponds to the particular iteration;

sampling, using the particular sampling time, the frequency of the oscillator signal, to determine a current count value that corresponds to a current frequency of the oscillator signal during the particular iteration, wherein the sampling time is less than a maximum sampling time;

scaling the current count value to a same scale as a target count value;

determining a next value of a code signal using a current value of the code signal, a scaled version of the current count value, the target count value, and a maximum code signal change per iteration, wherein an error associated with the scaled version of the current count value resulting from the particular sampling time is such that a calibration value of the code signal can be reached from the next value of the code signal within a remaining number of iterations of the plurality of iterations, and wherein the calibration value of the code signal corresponds to a desired frequency of the oscillator signal; and adjusting the frequency of the oscillator signal using the next value of the code signal prior to a start of a next iteration subsequent to the particular iteration.

20. The method of claim 19, further comprising, in response to completing the particular number of iterations, performing respective sets of operations for each iteration of a remaining number of iterations;

wherein performing the respective sets of operations includes, performing a second set of operations for a first iteration of the remaining number of iterations that includes:

sampling, using the maximum sampling time, the frequency of the oscillator signal, to determine a first count value; and determining a first next value of the code signal using the current value of the code signal, the first count value, and the target count value; and wherein performing the respective sets of operations includes, performing a third set of operations for a second iteration of the remaining number of iterations that includes:

sampling, using the maximum sampling time, the frequency of the oscillator signal to determine a second count value;

determining a second next value of the code signal using the second count value; and selecting a final value of the code signal from the first next value and the second next value of the code signal, wherein the final value of the code signal has a smallest error of the first next value and the second next value for the code signal.

21. The method of claim 19, wherein determining the next value of the code signal using the current value of the code signal, the scaled version of the current count value, the target count value, and the maximum code signal change per iteration includes performing an operation using the current value of the code signal, the maximum code signal change per iteration, and a difference between the target count value and the scaled version of the current count value.

22. The method of claim 19, wherein determining the particular sampling time includes determining a difference in the frequency of the oscillator signal resulting from two adjacent values of the code signal.

* * * * *